United States Patent [19]

Billig et al.

[11] Patent Number: 5,025,300
[45] Date of Patent: Jun. 18, 1991

[54] INTEGRATED CIRCUITS HAVING IMPROVED FUSIBLE LINKS

[75] Inventors: James N. Billig, Slatington; James D. Chlipala; Kuo H. Lee, both of Lower Macungie Township, Lehigh County; William J. Nagy, Bethlehem, all of Pa.

[73] Assignee: AT&T Bell Laboratories, Murray Hill, N.J.

[21] Appl. No.: 560,462

[22] Filed: Jul. 25, 1990

Related U.S. Application Data

[63] Continuation of Ser. No. 373,763, Jun. 30, 1989, abandoned.

[51] Int. Cl.[5] ............... H01L 29/34; H01L 27/02; H01L 23/48
[52] U.S. Cl. ............................. 357/51; 357/54; 357/65
[58] Field of Search ..................... 357/51, 54, 65

[56] References Cited

U.S. PATENT DOCUMENTS

| | | | |
|---|---|---|---|
| 3,792,319 | 2/1974 | Tsang | 317/235 |
| 4,455,194 | 6/1984 | Yabu et al. | 156/653 |
| 4,536,949 | 8/1985 | Takayama et al. | 357/51 |
| 4,628,590 | 12/1986 | Udo et al. | 357/51 |
| 4,692,190 | 9/1987 | Komatsu | 357/51 |
| 4,720,470 | 1/1988 | Johnson | 357/40 |
| 4,774,561 | 9/1988 | Takagi | 357/51 |
| 4,795,720 | 1/1989 | Kawanabe et al. | 357/51 |
| 4,853,758 | 8/1989 | Fischer | 357/51 |

FOREIGN PATENT DOCUMENTS

| | | | |
|---|---|---|---|
| 52-28280 | 3/1977 | Japan | 357/51 |
| 62-119938 | 1/1987 | Japan | 357/51 |

OTHER PUBLICATIONS

"Process and Structure for Laser Fuse Blowing", *IBM Technical Disclosure Bulletin*, vol. 31 (May 1989), p. 93.
U.S. patent application Ser. No. 07/084531 (F. H. Fischer Case 3).

*Primary Examiner*—J. Carroll
*Attorney, Agent, or Firm*—James H. Fox

[57] ABSTRACT

An integrated circuit includes a conductive fusible link (14) that may be blown by laser energy. The dielectric material (15) covering the fuse is etched away to expose the fuse. A protective dielectric layer (30) is formed on the fuse to a controlled thickness less than that of the interlevel dielectric. The resulting structure prevents shorts between conductors that might otherwise occur due to debris from the fuse-blowing operation, and provides protection to the integrated circuit. In addition, the fuse blowing operation is more consistent from fuse to fuse.

13 Claims, 1 Drawing Sheet

INTEGRATED CIRCUITS HAVING IMPROVED FUSIBLE LINKS

This application is a continuation of application Ser. No. 373,763 filed Jun. 30, 1989, abandoned.

BACKGROUND OF THE INVENTION

1. Field of the Invention

The present invention relates to a technique for making integrated circuits having improved fusible conductive links.

2. Description of the Prior Art

Integrated circuits frequently include fusible conductive links ("fuses") that may be rendered non-conductive (i.e., "blown") by the application of laser energy. For example, in dynamic or static memory chips, defective memory cells may be replaced by blowing the fuses associated with the defective cells, and activating a spare row or column of cells, which may also be accomplished by blowing fuses. Logic circuits may also be repaired or reconfigured by blowing fuses. For example, it is known to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible.

The reliability of blowing the fuses is significant, especially when a large number of fuses must be successfully blown for an integrated circuit to function properly. One limiting factor in successful fuse blowing is the minimum laser energy required to blow the fuses. That is, if the laser energy is not high enough, then some of the fuses that are to be blown will not in fact be rendered non-conductive. Such process variables as the thickness or width of the fuse, and the variations in the laser energy from one shot to the next, can affect the reliability of fuse blowing. On the other hand, the debris generated by successfully blowing the link can itself lead to reliability problems. That is, if the conductive link material (typically doped polysilicon, metal silicide, or a metal) is re-deposited on the chip after the fuse is blown, then it may land in an area that could cause reliability concerns. For example, the blown link material may re-deposit so as to short together two conductors on the same or different levels of the chip.

One technique for improving the reliability of blowing fuses with radiant (e.g., laser) energy is described in co-assigned U.S. patent application Ser. No. 07/084531 now U.S. Pat. No. 4,853,758. As taught therein, the dielectric material covering a fuse may be partially etched away, reducing its thickness over a fuse that is formed in a lower conductor level. This allows the fuse to blow more easily (that is, at a lower energy level) than if the full dielectric thickness were retained.

SUMMARY OF THE INVENTION

We have invented a technique for improving the reliability of blowing fuses in a solid state device. In one embodiment, the dielectric layer covering the fuse is selectively etched away to expose the fuse. A controlled thickness of a protective dielectric material is then formed to cover the link, prior to blowing the fuse. The thickness of the protective dielectric is less than the thickness of the dielectric that was etched from the fuse. In another embodiment, a protective dielectric layer is formed, and the fuse blown, before the deposition of a final caps dielectric layer.

DETAILED DESCRIPTION

Figure 1:
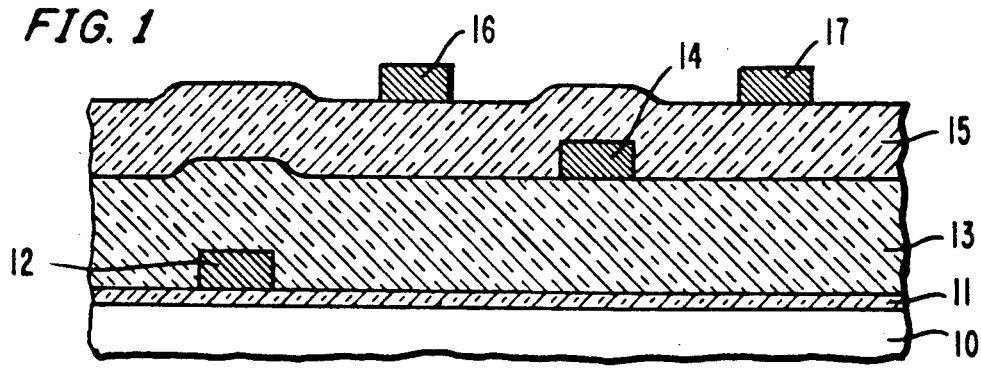
FIG. 1 shows an integrated circuit having multi-level metal conductors and an interlevel dielectric.

The following detailed description relates to an improved technique for forming integrated circuit fuses. Referring to FIG. 1, a first embodiment shows a semiconductor substrate 10 having formed thereon a dielectric layer 11. The substrate is silicon in the illustrative case, and the dielectric layer is typically grown or deposited silicon dioxide. Shown on the dielectric layer 11 is a first conductor 12, which is optional insofar as the present invention is concerned, but when present typically comprises doped polysilicon, and may also include a metal silicide in part or all of the conductor 12. Formed on conductor 12 is a dielectric layer 13, typically a flowable glass, such as a borophosphosilicate glass (BPSG). The layer 13 may be a spin-on glass, or may be deposited from a variety of precursor gases, including tetraethoxysilane (TEOS), or alternately silane ($SiH_4$), according to principles known in the art. The dielectric layer 13 is typically formed subsequent to the formation of active device regions, including, for example, gate, source, and drain regions, which may be made by methods known in the art.

A fusible link 14 is formed on layer 13 by depositing a metal layer, and patterning it by techniques known in the art. The metal is typically aluminum in present silicon technology, or gold in present group III-V technology, with other metals, including refractory metals, being possible. The fusible link may be a target area of a metal runner that is of the same geometry (width and height) as the rest of the runner. Alternately, the fusible link may be a portion of a metal runner that has reduced cross-sectional area for improved ease of blowing by laser irradiation. One technique for locally reducing the height of the metal runner in the fusible link portion is to first deposit a metal layer of a given thickness, in the conventional fashion. Then, a window is etched in the metal layer in the area were the fuse is to be formed. Next, a thin metal layer is deposited. The two metal layers are then patterned to form the desired metal runners having a thickness that includes both layers, while leaving a fusible link of reduced thickness in the region of the window. This optional fuse-forming technique is further described in co-pending application Ser. No. 07/374,423 filed 6/30/89, and co-assigned herewith. It is significant that metal tends to reflect laser energy more than polysilicon or metal silicides in most cases, so that the problem of successfully blowing a metal link is greater than for blowing fuses formed of these other materials.

The fusible link has a dielectric layer 15 formed thereon, which is referred to as the "interlevel" dielectric herein. Layer 15 is typically silicon dioxide deposited at a relatively low temperature, and may be deposited from TEOS or other precursor gases. In the illustrative embodiment, an optional second level metal conductor is formed on the interlevel dielectric layer 15 by deposition and patterning, which may be accomplished in the same manner as for the first level metal. In an illustrative process used with CMOS integrated circuits formed with 1.25 micrometer minimum linewidths, the first level metal runner is aluminum having a thickness of 500 nanometers (5000 angstroms) and a width of 1.75 micrometers. The interlevel dielectric is phosphorus doped TEOS having a thickness of 600 nanometers (6000 angstroms) over the fusible link.

Figure 2:
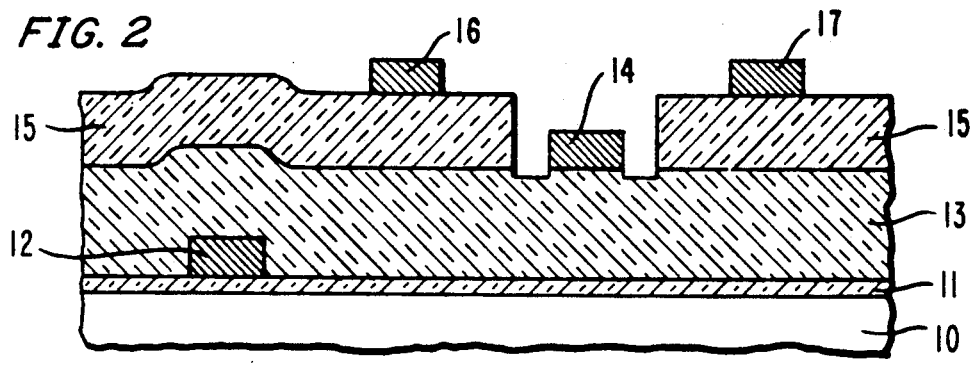
FIG. 2 shows the integrated circuit after etching off the interlevel dielectric from the fusible link.

Referring to FIG. 2, the interlevel dielectric is etched off the fusible link portion 14 of the patterned conductor. In the illustrative case, the etched region extends 10 micrometers along the length of the fusible link (perpendicular to the plane of the drawings), and extends 8 micrometers laterally. This may be accomplished by conventional lithographic and etching techniques. For example, in the illustrative case, a 1 micrometer thick photoresist layer (not shown) is deposited over the interlevel dielectric 15 (and second level metal conductors 16 and 17) and patterned by conventional lithographic techniques to expose the fusible link 14. The interlevel dielectric is then etched off the fusible link using reactive ion etching techniques known in the art. To ensure complete removal of the interlevel dielectric from the fusible link, over-etching is accomplished so that about 300 nanometers (3000 angstroms) of the glass layer 13 is also removed, as shown. Note that the photoresist serves as an etch mask to prevent removal of the interlevel dielectric from regions adjacent to the fusible link. After etching, the photoresist etch mask is removed by conventional techniques.

Figure 3:
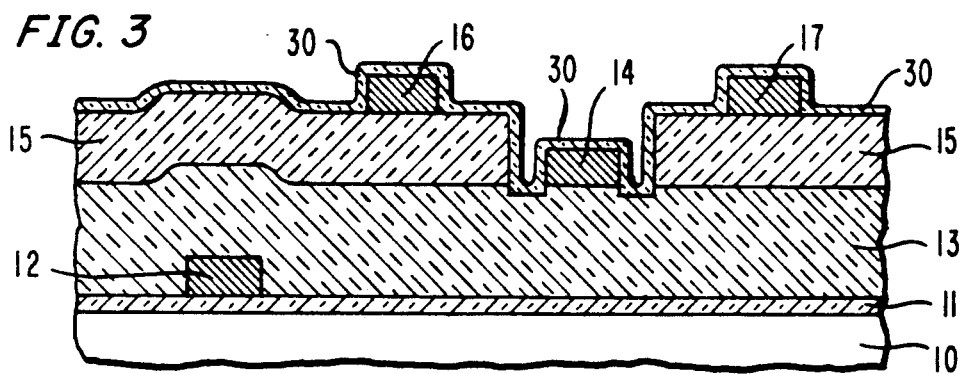
FIG. 3 shows the protective dielectric covering the fusible link.

Referring to FIG. 3, a layer of protective dielectric material 30 is formed on the exposed top surface (as viewed) of the integrated circuit precursor. The protective dielectric may be formed by deposition, as in the illustrative embodiment. Hence, the exposed portion of the fusible link 14, the second level metal runners 16, 17, the interlevel dielectric 15, and the portions of the glass layer 13 adjacent to the fusible link are covered by the protective dielectric 30. The thickness of the protective dielectric layer is less than that of the interlevel dielectric, and typically less than one-half the thickness of the interlevel dielectric. However, the thickness of the protective dielectric layer is typically at least 10 nanometers (100 angstroms), in order to provide adequate protection. In the illustrative embodiment, the protective dielectric layer is a low temperature oxide (TEOS) having a thickness of 200 nanometers (2000 angstroms). The protective dielectric layer is retained over the active device area of the integrated circuit. However, it is typically removed by standard lithographic and etching techniques from the bondpads, in order to allow for electrical connections to be made to the bondpads.

The use of a protective dielectric of reduced thickness (as compared to the interlevel dielectric) allows the fusible link to be blown more consistently and cleanly than would be the case if the full thickness of the interlevel dielectric layer 15 were retained. This is because a protective dielectric layer that is re-deposited, or grown, on the fusible link can have a much better controlled thickness than is typically possible for the interlevel dielectric. That is, the process steps for forming the interlevel dielectric usually include not only a deposition step, but also at least one etch-back step, followed by another deposition step, in order to obtain a void-free interlevel dielectric having a relatively planar surface. However, the etch-back step is not very easily controlled over the surface of the wafer, and the variations in the multiple depositions are additive, so that the final thickness of the interlevel dielectric may vary over a relatively wide range. For example, the thickness variation is typically greater than plus or minus 25 percent, and in one present two-level metal process in a 0.9 micrometer technology, the variation in the interlevel dielectric thickness is about plus or minus 50 percent for a nominal 700 nanometer (7000 angstrom) thickness. On the other hand, the re-deposited protective dielectric typically has a thickness that is controlled to within plus or minus 10 percent in present processes. A grown dielectric may also have a relatively well controlled thickness. The use of the inventive technique allows the dielectric layer to fracture more uniformly, and the molten (or vaporized) link material to be ejected more consistently.

Figure 4:
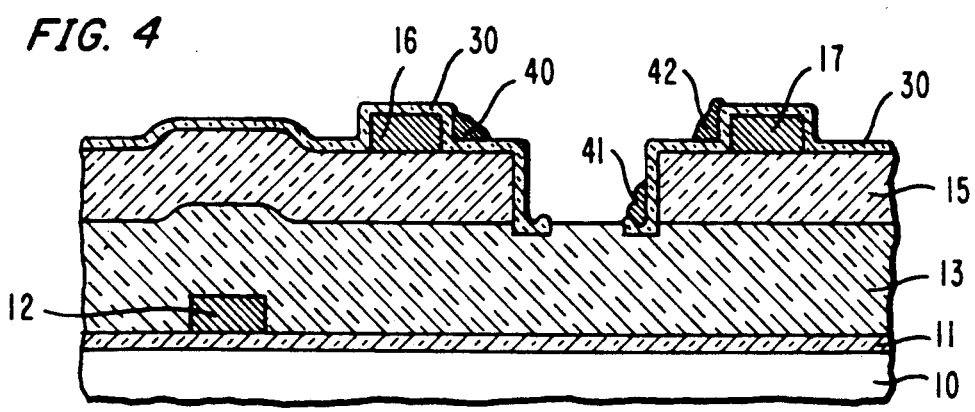
FIG. 4 shows debris resulting from blowing the fusible link.

Referring to FIG. 4, the fusible link area is shown after the link is blown by application of laser energy. For the above-noted fusible link, a neodymium-YAG laser at a wavelength of 1064 nanometers and energy of about 1.25 micro-Joules, using a 45 nanosecond full-width-half-maximum (FWHM) pulse, is sufficient to blow the link. As can be seen in the illustrative case, the metal debris 40-42 that may result is prevented by the protective dielectric from contacting adjacent conductor regions. Otherwise, it is apparent that the debris could readily short out the various first and second level metal conductors to the same or another metal level. After the link-blowing operation, the integrated circuit wafer is desirably cleaned in a commercial cleaning solution (e.g. PRS 1000) to remove loose debris. A final "caps" layer, typically of silicon nitride or silicon dioxide, is usually deposited over the surface of the integrated circuit for protection, according to principles known in the art.

The foregoing illustrative example has shown the fusible link in the bottom metal level in a two metal level structure, in which case the dielectric removed from the fuse is an "interlevel" dielectric. However, the fuse may be located in the top metal level (e.g. 16, 17), which is normally covered by a relatively thick "caps" layer of silicon dioxide or silicon nitride (not shown). In that case, the caps layer may be selectively etched to expose the fuse, and the protective layer formed prior to the fuse blowing operation. If desired, an optional final caps layer may then be deposited to help ensure protection of the device. Alternately, the protective dielectric layer may be formed on the top metal layer, and the fuse blown, prior to deposition of the final caps layer. In that case, no selective etching of the caps layer is necessary. Still more metal levels are possible, with the use of the protective dielectric according to the inventive technique being possible for fuses formed in any of the patterned metal levels. It is also possible to practice the present invention for fuses formed in a polysilicon or silicide conductor level (e.g., 12 in FIG. 1).

Although silicon dioxide has been described as the protective dielectric in the illustrative embodiment above, the use of other dielectrics is possible. For example, silicon nitride and silicon oxynitride may be used. The use of a grown (instead of deposited) protective dielectric is also possible. For example, an aluminum conductor may have its surface oxidized to obtain a protective dielectric surface layer of $Al_2O_3$ of the desired thickness. This may be conveniently accomplished by introducing oxygen into the plasma-producing apparatus (e.g., a reactive ion etcher) that was previously used to etch the pattern into the aluminum layer. However, note that a grown dielectric will form only over the exposed surfaces (top and sides) of the patterned conductor levels (e.g., 14, 16 and 17), and will not form over the interlevel dielectric. Still other metal used to form the patterned metal level that includes the fusible links may have oxides, nitrides, or other dielectric layers grown thereon.

In addition to the above-noted advantages relating to reliability and ease of link blowing, the use of the protective dielectric helps prevent contaminants from reaching the active device areas on the integrated circuit substrate. This allows the laser processing to be accomplished under non-clean room conditions, and also helps protect the integrated circuit from scratches.

What is claimed is:

1. An integrated circuit comprising a patterned metal level formed on a first layer of dielectric material (e.g., 13), and a second layer of dielectric material (e.g., 15) of a given thickness covering portions of said patterned metal level, wherein said patterned metal level includes at least one conductive fusible link portion (e.g., 14) that is not covered by said second layer of dielectric material, Characterized in that said fusible link portion and said second layer of dielectric material are covered by a protective dielectric layer (e.g., 30) having a thickness less than said given thickness, wherein said second layer and said protective dielectric layer each essentially comprise silicon dioxide.

2. The integrated circuit of claim 1 wherein said fusible link is aluminum.

3. The integrated circuit of claim 1 wherein said fusible link is a refractory metal.

4. The integrated circuit of claim 1 further comprising an additional patterned metal level (e.g., 16, 17) formed on said second layer of dielectric material, wherein said second layer of dielectric material is an interlevel dielectric.

5. The integrated circuit of claim 1 having a top metal level, wherein said at least one conductive fusible link is formed in said top metal level.

6. The integrated circuit of claim 1 wherein said protective dielectric layer has a thickness less than on-half said given thickness.

7. The integrated circuit of claim 1 wherein said protective dielectric layer has a thickness of at least 10 nanometers.

8. An integrated circuit comprising a patterned metal level formed on a first layer of dielectric material (e.g., 13), and a second layer of dielectric material (e.g., 15) of a given thickness covering portions of said patterned metal level, wherein said patterned metal level includes at least one conductive fusible link portion (e.g., 14) having top and side surfaces that are not covered by said second layer of dielectric material, Characterized in that said fusible link portion of said patterned metal level has formed thereon a protective dielectric layer (e.g., 30) comprising an oxide or nitride of said metal having a thickness on said top and side surfaces of at least 10 nanometers but less than said given thickness.

9. The integrated circuit of claim 8 wherein said fusible link is aluminum.

10. The integrated circuit of claim 8 wherein said fusible link is a refractory metal.

11. The integrated circuit of claim 8 further comprising an additional patterned metal level (e.g., 16, 17) formed on said second layer of dielectric material, wherein said second layer of dielectric material is an interlevel dielectric.

12. The integrated circuit of claim 8 having a top metal level, wherein said at least one conductive fusible link is formed in said top metal level.

13. The integrated circuit of claim 8 wherein said protective dielectric layer has a thickness less than on-half said given thickness.

* * * * *